United States Patent [19]
Koifman et al.

[11] Patent Number: 5,514,999
[45] Date of Patent: May 7, 1996

[54] DIFFERENTIAL SWITCHED CAPACITOR CIRCUIT

[75] Inventors: Vladimir Koifman, Rishon-Lezion; Yachin Afek, Kfar Saba, both of Israel

[73] Assignee: Motorola, Inc., Schaumburg, Ill.

[21] Appl. No.: 327,723

[22] Filed: Oct. 24, 1994

[30] Foreign Application Priority Data

Nov. 11, 1993 [GB] United Kingdom ............ 9323274

[51] Int. Cl.[6] ........................................ H03F 1/14
[52] U.S. Cl. ........................................ 330/9; 330/51
[58] Field of Search ............... 330/9, 51, 107; 327/91, 94, 337, 554

[56] References Cited

U.S. PATENT DOCUMENTS

| | | | |
|---|---|---|---|
| 4,633,223 | 12/1986 | Senderowicz | 330/9 X |
| 4,862,121 | 8/1989 | Hochschild et al. | 330/107 X |
| 5,136,255 | 8/1992 | Fattaruso et al. | 330/51 X |
| 5,220,286 | 6/1993 | Nadeem | 330/9 |

*Primary Examiner*—Steven Mottola
*Attorney, Agent, or Firm*—Gary W. Hoshizaki

[57] ABSTRACT

A differential switched capacitor circuit (6) for sampling a differential input signal (IP, IM) in different sampling phases (PHI0, PHI1) and for correcting errors at an output thereof, comprises:

m switched capacitor stages (8–16) coupled in a chain, a first stage (8) being coupled to the output of the circuit, each of the m switched capacitor stages (8–16) being coupled to an adjacent stage in the chain depending on the sampling phase such that a charge representative of the error is equally shared between adjacent stages in the chain and wherein the mth stage (16) is selectively coupled to an end node so as to cancel the charge thereon, whereby after a number of sampling phases the error at the output is substantially reduced by a factor of up to 1/m.

16 Claims, 6 Drawing Sheets

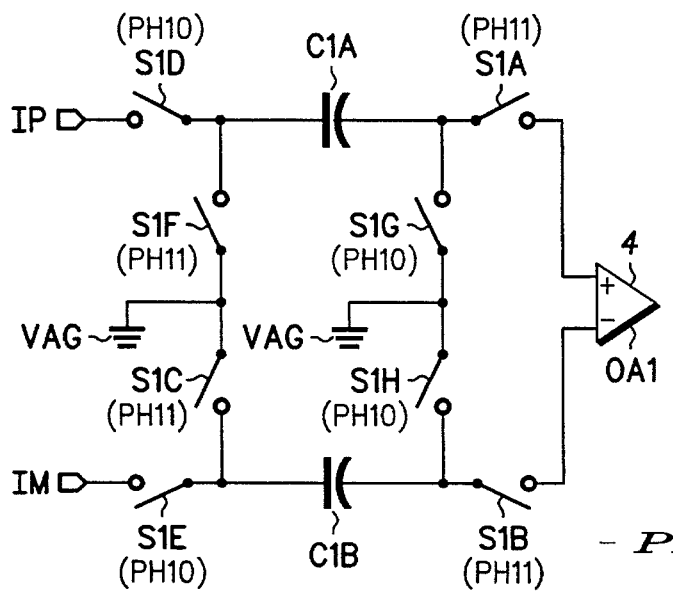
FIG. 1
- PRIOR ART -
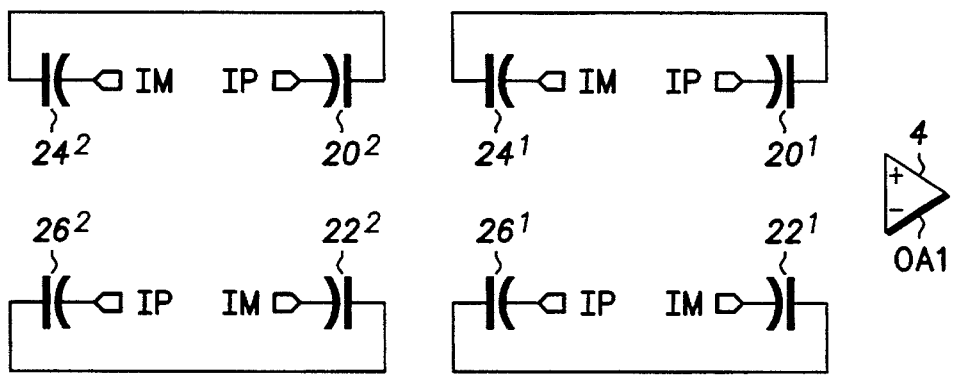
- PH10 CONNECTIONS - FIG. 10
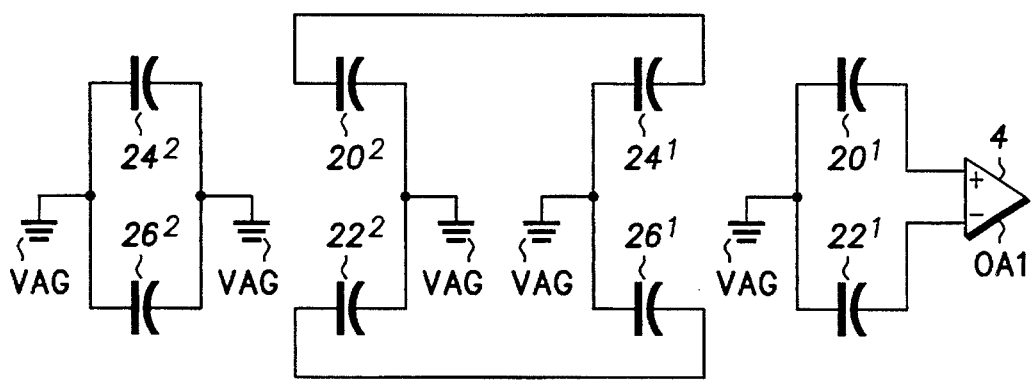
- PH11 CONNECTIONS - FIG. 11

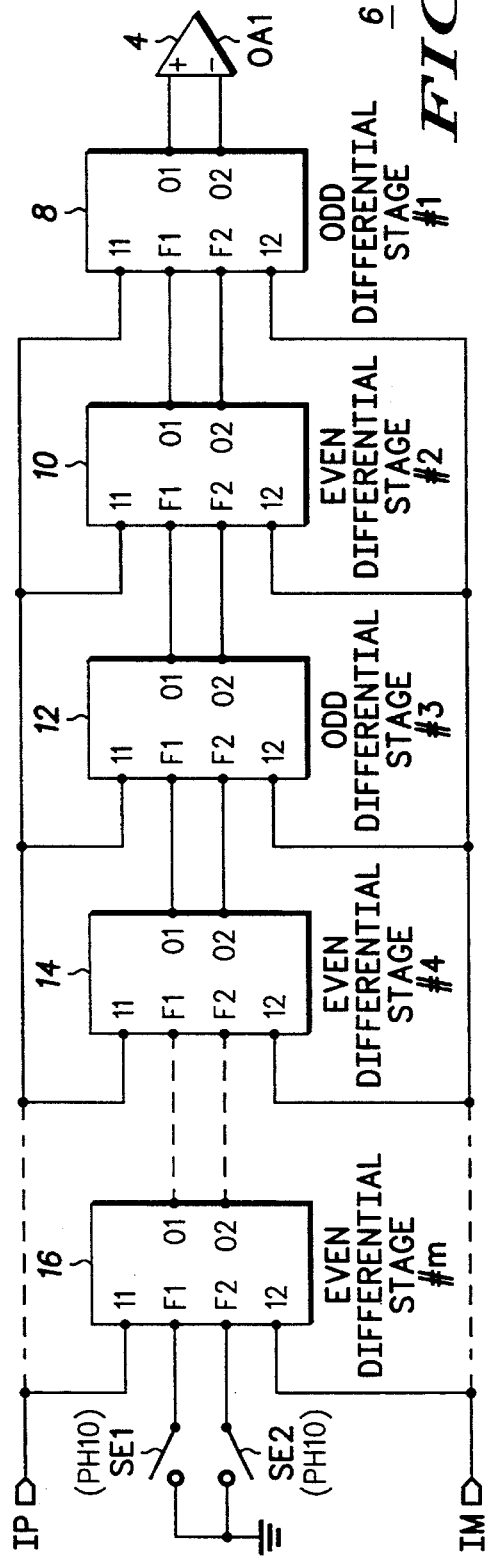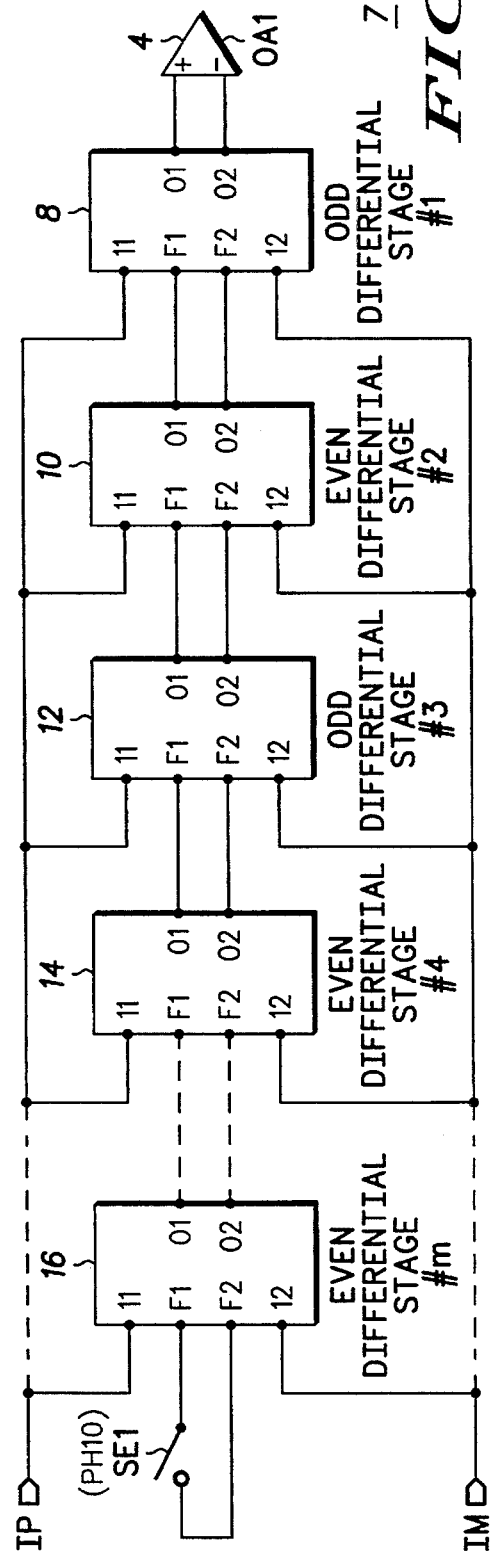

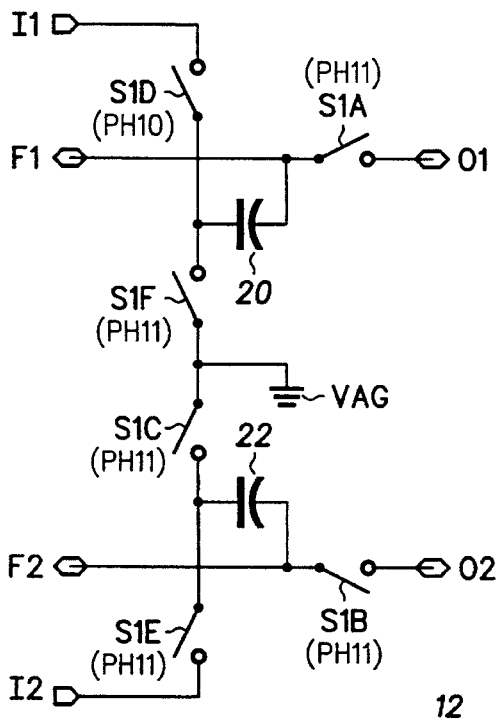
-ODD- FIG. 5
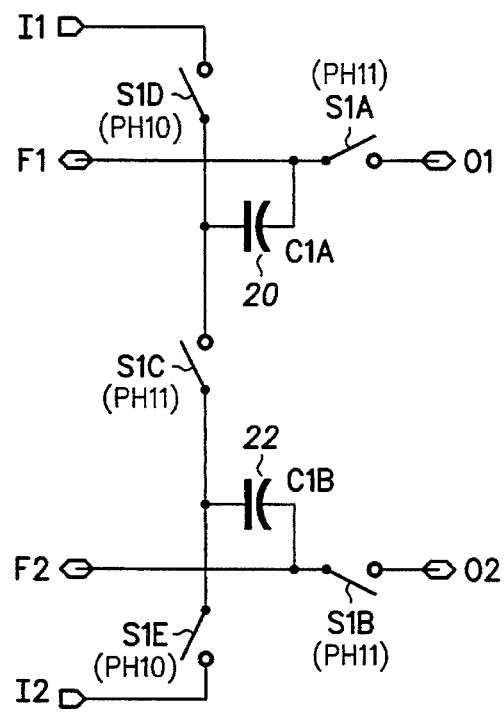
-ODD- FIG. 7
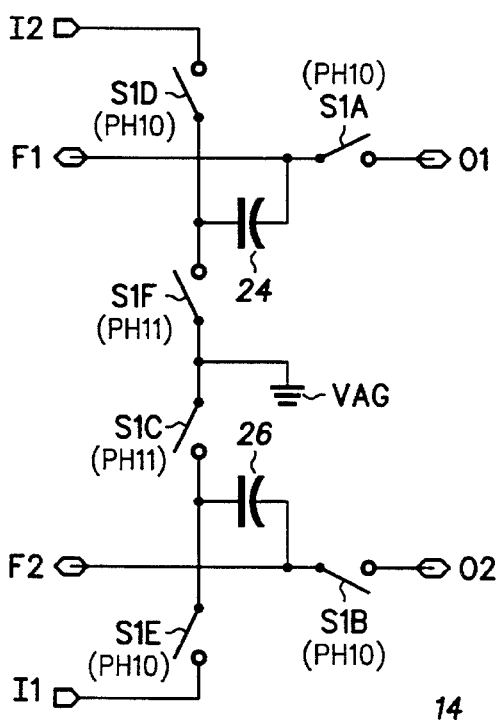
-EVEN- FIG. 6
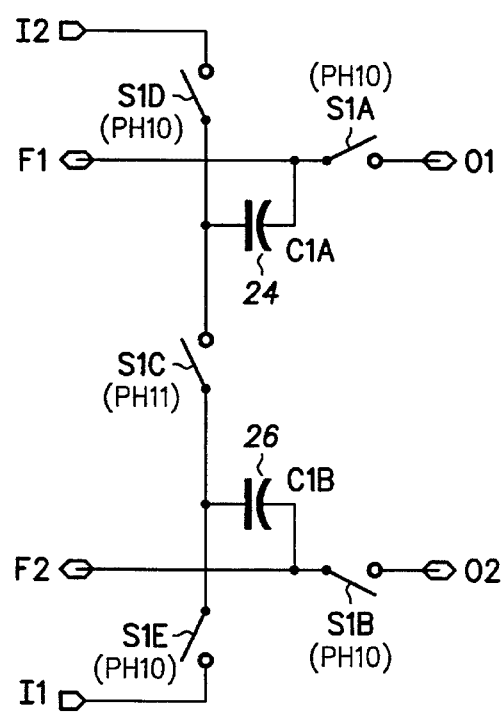
-EVEN- FIG. 8

DIFFERENTIAL SWITCHED CAPACITOR CIRCUIT

This invention relates to a differential switched capacitor circuit.

BACKGROUND OF THE INVENTION

Switching systems which comprise a differential switched capacitor circuit, having outputs coupled to the inputs of an operational amplifier, are well known.

The operational amplifier of such systems usually has some level of noise. This may be caused by thermal or flicker noise of the operational amplifier's internal components or shot noise in its input currents. This noise of the operational amplifier significantly reduces the dynamic range of the system and thus careful operational amplifier design is required.

In mixed-signal integrated circuits (ICs), that is ICs which process both analog and digital signals, digital spikes may migrate to the analog part of the IC, with the result that the noise level of the operational amplifier increases. In practice, it is virtually impossible to avoid digital spike penetration to the analog part and thus, noise in such mixed-signal ICs is particularly problematical.

In oversampling systems, only the low frequency noise components, which fall into the system's bandwidth, are problematical. However, switched capacitor circuits sample the high frequency noises on the capacitors and alias them to low frequencies. Thus, such sampled noises also add to the noise problem.

It would therefore be desirable to design a switched capacitor circuit which reduces the aliasing of high frequency noise and spikes to low frequencies and which also reduces low frequency noise.

A number of solutions, which attempt to address the noise problems, have been developed. One solution is described in a paper by Mike Rebeschini et al, entitled 'A 16-bit 160 kHz A/D Converter Using SigmaDelta Modulation' (IEEE Journal of Solid State Circuits, Vol. 25, #2, April 1990). This solution is commonly called the 'Auto-Zero Circuit' or 'Noise Correlation Circuit'.

The auto-zero circuit compensates for the error signal on the inputs of the operational amplifier. The error signal may be due to offset and/or low frequency noise. The compensation is based on measuring the operational amplifier input error voltage in one phase and using it for input error compensation during the other phase. It is assumed that the input error signal does not significantly change between phases.

In mixed-signal systems, digital spikes and high frequency noise change rapidly between the measurement phase and the compensation phase. Hence, in such systems, the noise cannot be properly compensated and this approach cannot prevent aliasing noise to low frequencies.

An additional disadvantage of the auto-zero circuit is that it requires the operational amplifier to swing from the signal level to analog ground, each phase. This produces high bandwidth and slew rate requirements. Implementations are known which meet the slew requirements, however, these known implementations are extremely sensitive to stray capacitance.

A number of different noise reduction circuits are also known. However, they all work on the same principle as that described above: the noise is assumed to be DC offset or low frequency noise and the noise during a present phase is compensated according to the noise during the previous phase. As described above, such circuits suffer from severe disadvantages, since they do not reduce high frequency noise aliasing and cannot compensate for noise due to digital spikes in mixed-signal systems

SUMMARY OF THE INVENTION

In accordance with the present invention there is provided a differential switched capacitor circuit for sampling a differential input signal in different sampling phases and for correcting errors at an output thereof, the circuit comprising:

m switched capacitor stages coupled in a chain, a first stage being coupled to the output of the circuit, each of the m switched capacitor stages being coupled to an adjacent stage in the chain depending on the sampling phase such that a charge representative of the error is equally shared between adjacent stages in the chain and wherein the mth stage is selectively coupled to an end node so as to cancel the charge thereon, whereby after a number of sampling phases the error at the output is substantially reduced by a factor of up to 1/m.

Thus, the present invention is able to measure and compensate for the noise during the same phase. It achieves this by compensating the noise error from previous phases and by simultaneously measuring the 'new' noise error, in order to compensate for this 'new' error during the next few phases.

BRIEF DESCRIPTION OF THE DRAWINGS

A number of embodiments of the invention will now be described, by way of example only, with reference to the accompanying drawings in which:

FIG. 1 is a block schematic diagram of a prior art differential switched capacitor circuit;

FIG. 2 is a block schematic diagram of a first differential switched capacitor circuit in accordance with the present invention;

FIG. 3 is a block schematic diagram of a second differential switched capacitor circuit in accordance with the present invention;

FIG. 5 is a circuit diagram of a first, first type of switched capacitor stage in accordance with the present invention for use in a differential switched capacitor circuit such as that shown in FIG. 2, 3 or 4;

FIG. 6 is a circuit diagram of a first, second type of switched capacitor stage in accordance with the present invention for use in a differential switched capacitor circuit such as that shown in FIG. 2, 3 or 4;

FIG. 7 is a circuit diagram of a second, first type of switched capacitor stage in accordance with the present invention for use in a differential switched capacitor circuit such as that shown in FIG. 2, 3 or 4;

FIG. 8 is a circuit diagram of a second, second type of switched capacitor stage in accordance with the present invention for use in a differential switched capacitor circuit such as that shown in FIG. 2, 3 or 4;

FIG. 10 is a schematic diagram illustrating the connections of the capacitors of the switched capacitor stages of the circuit of FIG. 9, during a first phase, PHI0;

FIG. 11 is a schematic diagram illustrating the connections of the capacitors of the switched capacitor stages of the circuit of FIG. 9 during a second phase, PHI1;

DETAILED DESCRIPTION OF THE DRAWINGS

Figure 4:
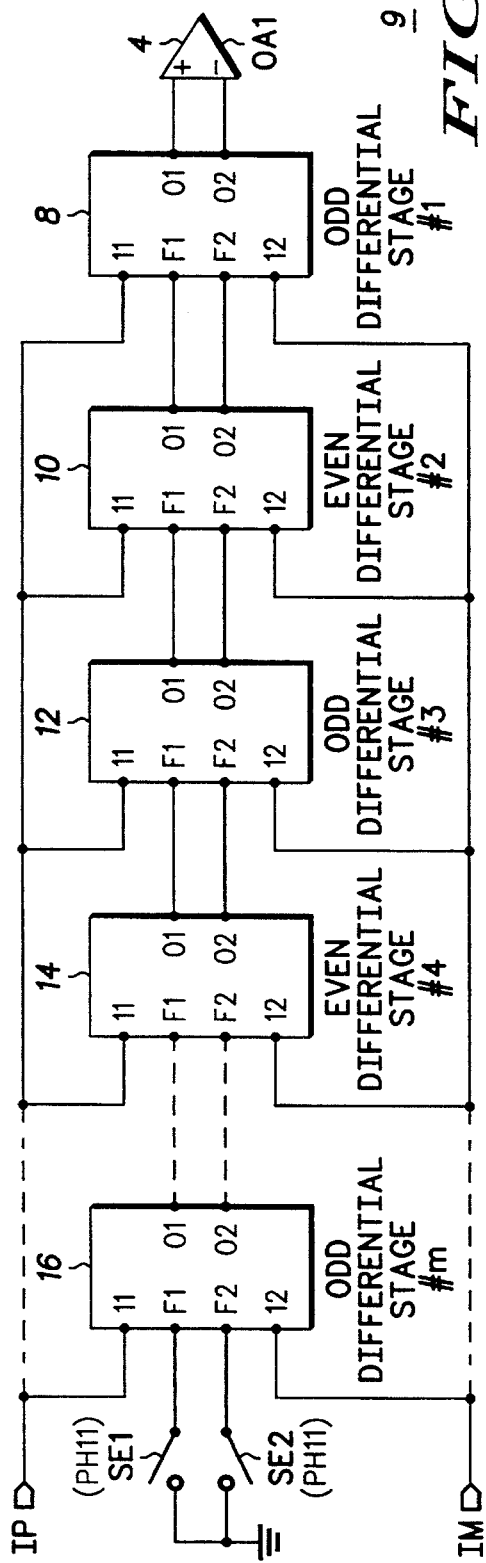
FIG. 4 is a block schematic diagram of a third differential switched capacitor circuit in accordance with the present invention.

Referring firstly to FIG. 1, a typical prior art differential switched capacitor circuit 2 for coupling to an operational amplifier 4 comprises two capacitors C1A and C1B and switches S1A–S1H which are operated so as to charge and discharge the capacitors in two phases, a first phase PHI0 and a second phase PHI1. The name of the phase near each switch in FIG. 1 indicates the phase when the switch is closed (or ON). This convention will be maintained throughout the following description of the drawings.

During the first phase PHI0, the left plates of the capacitors C1A and C1B are connected to the differential inputs IP and IM via switches S1D and S1E respectively. At the same time, the right plates of the capacitors C1A and C1B are connected to analog ground VAG, via switches S1G and S1H respectively. During the first phase PHI0, the capacitors C1A and C1B are charged by the input voltage at the differential inputs IP and IM.

During the second phase PHI1, the left plates are connected to analog ground VAG via switches S1F and S1C respectively, while their left plates are connected to the inputs of the operational amplifier 4 via switches S1A and S1B respectively. The operational amplifier 4 integrates the charge on the capacitors C1A and C1B.

As described above, such known circuits suffer from a number of problems due to low frequency noise, digital spikes and aliasing of high frequency noise.

Referring now to FIG. 2, a differential switched capacitor circuit 6 in accordance with the invention is shown coupled to an operational amplifier 4. The differential switched capacitor circuit 6 comprises a plurality of switched capacitor stages 8, 10, 12, 14, 16. The number of stages is arbitrary and can vary between 2 and m, where m is an integer. The greater the number of stages, the greater is the reduction in noise.

The plurality of switched capacitor stages 8–16 comprise at least one of a first type of stage ODD (stages 8, 12) and at least one of a second type of stage EVEN (stages 10, 14 and 16). The stages are arranged so that an adjacent stage is a different type of stage. Each of the first and second types of stages comprises first and second capacitors (see FIGS. 5–8), first and second inputs I1 and I2 coupled to receive the differential input signal IP and IM, first and second outputs O1 and O2 and third and fourth inputs F1 and F2.

The first and second outputs O1 and O2 of the first stage 8 form the output of the differential switched capacitor circuit 6. The output of the circuit is coupled to the differential inputs of the operational amplifier 4 and the third and fourth inputs F1 and F2 of the mth stage 16 are preferably coupled via end switches SE1 and SE2 to a node coupled to analog ground VAG. An alternative differential switch capacitor circuit 7 is shown in FIG. 3 (like components are referred to by the same reference numeral) wherein the third and fourth inputs F1 and F2 of the mth stage 16 are coupled together via a switch SE1'.

In FIGS. 2 and 3, the mth stage 16 is shown to comprise the second type of stage EVEN. The mth stage 16, however, may comprise the first type of stage ODD as shown in the switched capacitor circuit 9 of FIG. 4 (like components to that of FIGS. 2 and 3 are referred to by the same reference numeral). In this arrangement 9, the end switches SE1 and SE2 are arranged to be closed during the second phase PHI1.

FIG. 5 shows the internal structure of the first type of stage ODD in accordance with the present invention, such as stage 12 of FIGS. 2–4.

The first type of stage ODD 12 comprises first and second capacitors 20 and 22. During the first phase PHI0, the left plates of the first 20 and second 22 capacitors are coupled to the first I1 and second I2 inputs respectively of the stage 12, via switches S1D and S1E. The right plates of the first 20 and second 22 capacitors are coupled to the third F1 and fourth F2 inputs respectively. During the second phase PHI1, the left plates of the first 20 and second 22 capacitors are coupled to analog ground VAG, via switches S1F and S1C respectively. The right plates of the first 20 and second 22 capacitors are coupled to the first O1 and second O2 outputs respectively, via switches S1A and S1B.

FIG. 6 shows the internal structure of the second type of stage EVEN in accordance with the present invention, such as stage 14 of FIGS. 2–4.

The second type of stage EVEN 14 comprises first and second capacitors 24 and 26. During the first phase PHI0, the left plates of the first 24 and second 26 capacitors are coupled to the second I2 and first I1 inputs respectively of the stage 12, via switches S1D and S1E. The right plates of the first 24 and second 26 capacitors are coupled to the first O1 and second O2 outputs respectively, via switches S1A and S1B. During the second phase PHI1, the left plates of the first 24 and second 26 capacitors are coupled to analog ground VAG, via switches SIF and S1C respectively. The right plates of the first 24 and second 26 capacitors are coupled to the third F1 and fourth F2 inputs respectively.

The first and second type of stages are similar except for the different phases when the switches S1A and S1B of the respective type of stages are closed and also the connections of the first and second capacitors to the first and second inputs.

Alternative arrangements of the first ODD and second EVEN types of stages, without connections to analog ground VAG, are shown in FIGS. 7 and 8, respectively. Like components to those of FIGS. 5 and 6 are referred to by the same reference numeral.

For the first type of stage ODD, during the first phase PHI0, the left plates of the first 20 and second 22 capacitors are coupled to the first I1 and second I2 inputs respectively, via switches S1D and S1E. The right plates of the first 20 and second 22 capacitors are coupled to the third F1 and fourth F2 inputs respectively. During the second phase PHI1, the left plates of the first 20 and second 22 capacitors are coupled together via switch S1C. The right plates of the first 20 and second 22 capacitors are coupled to the first O1 and second O2 outputs respectively, via switches S1A and S1B.

For the second type of stage EVEN, during the first phase PHI0, the left plates of the first 24 and second 26 capacitors are coupled to the second I2 and first I1 inputs respectively, via switches S1D and S1E. The right plates of the first 24 and second 26 capacitors are coupled to the first O1 and second O2 outputs respectively, via switches S1A and S1B. During the second phase PHI1, the left plates of the first 24 and second 26 capacitors are coupled together via switch S1C. The right plates of the first 24 and second 26 capacitors are coupled to the third F1 and fourth F2 inputs respectively.

Figure 9:
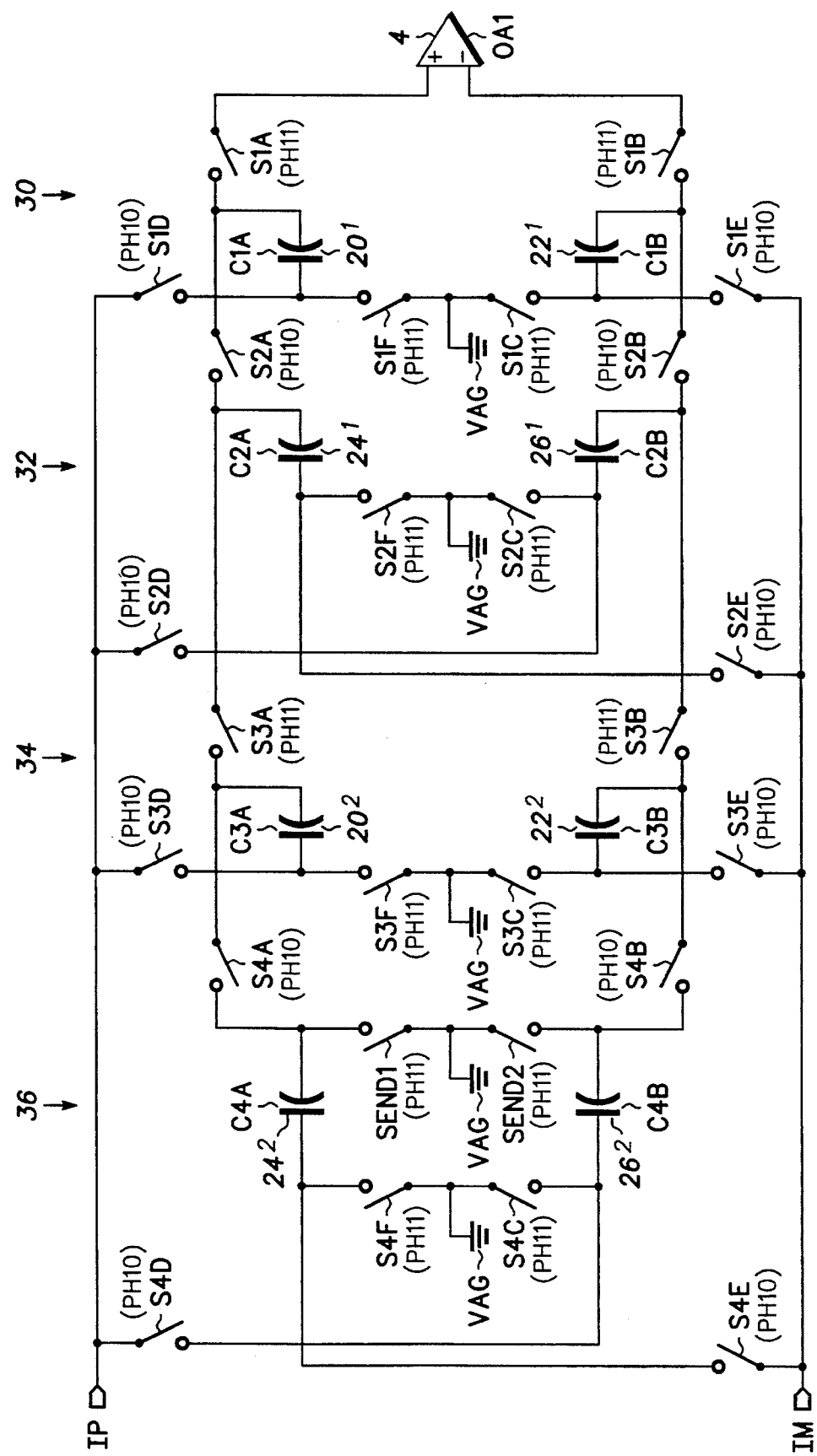
FIG. 9 is a schematic circuit diagram of a four-stage differential switched capacitor circuit in accordance with the invention.

FIG. 9 shows a four-stage differential switched capacitor circuit 29 in accordance with the present invention having a first stage 30 of the first type ODD as shown in FIG. 5, a second stage 32 of the second type EVEN as shown in FIG. 6, a third stage 34 of the first type ODD as shown in FIG. 5 and a fourth stage 36 of the second type as shown in FIG. 6. The connections of the capacitors $20^1$, $20^2$, $22^1$, $22^2$, $24^1$, $24^2$, $26^1$, and $26^2$, of the different stages of the four-stage switched capacitor circuit 29 during the first phase PHI0 is shown in FIG. 10 and during the second phase PHI1 is shown in FIG. 11. All the capacitors have the same value of capacitance.

During the first phase PHI0, each of the four stages 30–36 sample the differential input signal at the inputs IP and IM. During the second phase PHI1, the differential switched capacitor circuit 29 drives the charge on the capacitors $20^1$ and $22^1$ of the first stage 30 onto the inputs of the operational amplifier 4 and redistributes the charges between the other capacitors. The operational amplifier 4 integrates the charge transferred to its inputs.

The operation of the switched capacitor circuit in accordance with the present invention will now be described. The expressions VIP(n) and VIM(n) represent the voltage signals on the inputs IP and IM respectively and E(n) is the error signal input to the system from the operational amplifier 4. 'n' is a time index of the system and represents the nth step of integration. Each step comprises a first phase PHI0 and a second phase PHI1.

The error signal E(n) is the parasitic residual voltage between the inputs of the operational amplifier, which is sampled on the capacitors connected to the inputs of the operational amplifier ($20^1$ and $22^1$ of FIG. 9). For an ideal operational amplifier E(n)=0. In practice, as described above, digital spike noise, operational amplifier device noise and/or thermal charge fluctuations in the integrating capacitors can contribute to the error signal E(n). The error signal E(n) also has a component due to the DC offset of the operational amplifier, the finite gain of the operational amplifier and the finite frequency response, which produces incomplete settling of the differential input voltage signals VIP(n) and VIM(n). The error signal E(n) is a differential signal and so common mode components are ignored hereinafter.

Since in differential circuits the behaviour of the two differential paths is symmetrical, the following explanations are limited to one path only: the path including capacitors $24^2$, $20^2$, $24^1$ and $20^1$. It will be appreciated, however, that similar effects will also exist in the other path. Correlation effects between differential parts are also ignored. While such effects exist in circuits without a regular connection to analog ground VAG, they do not change the final result.

Let us denote the charges at the end of each phase in each capacitor as Q1(n), Q2(n), . . . Qi(n), . . . Qm(n), for a m stage system, with stage 1 coupled to the operational amplifier at the right and stage m at the left. "i" is the index of each differential pair of capacitors. Thus, a system of 2 m capacitors has an index changing from 1 to m (Q1 . . . Qm).

The system obeys linearity and superposition principles in the following sense. Error signal E(n) and input signals VIP(n) contribute charges C×Ei(n1) and C×VIPi(n1) for n1>=n. The total charge due to both signals is therefore given by:

$$Qi(n1)=C\times Ei(n1)+C\times VIPi(n1) \quad (1)$$

Equation 1 shows that we can analyse the error signal separately.

The system is also linear in the time sense. If the error signal comprises error inputs E(n1) and E(n2). At time n3>n2>n1, the charge Qi(n3) is equal to the superposition of error signals E(n1) and E(n2). In other words, if it is assumed that the error signal at time n1 (E(n1)) causes the charge at time n3 to be equal to Qi1(n3), and no other errors happen afterwards, and that the error at time n2 (E(n2)) causes the charge at time n3 to be equal to Qi2(n3) and that no other errors were produced before time n2, since the system is linear in the time sense, the charge observed at time n3, if both errors E(n1) and E(n2) occur, would be equal to $$Qi(n3)=Qi1(n3)+Qi2(n3) \quad (2)$$

With respect to the contribution of the inputs VIP, VIM, it is assumed there is no common mode input component so that, $$\frac{VIP+VIM}{2}=VAG \quad (3)$$

It is also assumed that the switches are ideal switches: that is, no finite impedance, charge injection effects, control signal feed-through, parasitic capacitances, etc.

At the end of the first phase PHI0, each capacitor is charged with C×VIP or C×VIM respectively. The middle point between the capacitors in each stage is at analog ground, VAG. At the end of the integrating second phase PHI1, the capacitors of the first stage dump their charge into the integrator (operational amplifier).

The impact of the error signal E(n) will now be discussed. As explained above, it is assumed that the input signals VIP and VIM are zero. Furthermore, for simplicity, the explanation will be limited to the four-stage differential switched capacitor circuit 29 shown in FIG. 9. Assume E(1)=E and E(n)=0(n>1). At the end of the first and second phases PHI0 and PHI1, at n=1, by applying charge redistribution, the charges on the capacitors correspond to those given in Table 1.

TABLE 1

| | (n = 1) | | | |
|---|---|---|---|---|
| | Q4 Capacitor $24^2$ | Q3 Capacitor $20^2$ | Q2 Capacitor $24^1$ | Q1 Capacitor $20^1$ |
| PHI1 | 0 | 0 | 0 | C × E |
| PHI0 | 0 | 0 | C × E/2 | C × E/2 |

The charges Qi on the capacitors, at the end of the second phase PHI1, are dependent on the charge Qi at the end of the previous first phase PHI0. The charges Qi are given by:

$$Q1 = 0$$

$$Q2(n+1) = \frac{(Q2(n) + Q3(n))}{2}$$

$$Q3(n+1) = \frac{(Q2(n) + Q3(n))}{2}$$

$$Q4 = 0$$

The charges Qi, at the end of the first phase PHI0, are dependent on the charge Qi at the end of the previous second phase PHI1, and are given by:

$$Q1(n+1) = \frac{(Q2(n) + Q1(n))}{2}$$

$$Q2(n+1) = \frac{(Q2(n) + Q1(n))}{2}$$

$$Q3(n+1) = \frac{(Q4(n) + Q3(n))}{2}$$

$$Q4(n+1) = \frac{(Q4(n) + Q3(n))}{2}$$

By applying charge conservation for n=2, the charges on the capacitors become:

TABLE 2

| | Q4 Capacitor $24^2$ | Q3 Capacitor $20^2$ | Q2 Capacitor $24^1$ | Q1 Capacitor $20^1$ |
|---|---|---|---|---|
| PHI1 | 0 | C × E/4 | C × E/4 | 0 |
| PHI0 | C × E/8 | C × E/8 | C × E/8 | C × E/8 |

Thus, during the second phase PHI1 for n=2, a charge of C×E/2 is returned to an input of the operational amplifier, whereby half of the residual error at time n=1 is corrected.

By applying charge conservation for n=2, the charges on the capacitors become:

TABLE 3

| | Capacitor $24^2$ | Capacitor $20^2$ | Capacitor $24^1$ | Capacitor $20^1$ |
|---|---|---|---|---|
| | (n = 3) | | | |
| PHI1 | 0 | C × E/8 | C × E/8 | 0 |
| PHI0 | C × E/16 | C × E/16 | C × E/16 | C × E/16 |

Thus, at n=3, an additional ⅛ of the error is discharged to an input of the operational amplifier, and 1/16 of the charge on capacitor $20^1$ is lost.

By applying charge conservation for n=4, the charges on the capacitors become:

TABLE 4

| | Capacitor $24^2$ | Capacitor $20^2$ | Capacitor $24^1$ | Capacitor $20^1$ |
|---|---|---|---|---|
| | (n = 4) | | | |
| PHI1 | 0 | C × E/16 | C × E/16 | 0 |
| PHI0 | C × E/32 | C × E/32 | C × E/32 | C × E/32 |

Thus, at n=4, an additional 1/16 of the error is discharged to an input of the operational amplifier, and 1/32 of the charge on capacitor $20^1$ is lost.

It will therefore be appreciated that the total correction provided by the differential switched capacitor circuit 29 is:

$$C \times E/2 + C \times E/8(1+\tfrac{1}{2}+\tfrac{1}{4}+\tfrac{1}{8}) = C \times E \times \tfrac{3}{4}$$

The four-stage circuit 29 in accordance with the invention therefore corrected ¾ of the error and so reduced the original error by a factor of 4. The following analysis demonstrates that for a m stage differential switched capacitor circuit, the error is reduced by a factor of m.

The differential switched capacitor circuit in accordance with the invention may comprise an even number of stages or an odd number of stages. The same principles apply for the even and odd number of stages. However, the expressions for the charge sharing differ for these two cases because the charge on the last stage is zero in the first phase PHI0 for the odd number of stages and in the second phase PHI1 for the even number of stages. The following explanation relates to a differential switched capacitor circuit having an even number of stages 2m.

Assuming the error E(n)=E for all times n, after some time, lets say when n=1, a steady state is achieved. At this point, the charges Qi(n) at the first PHI0 and second PHI1 phase are independent of n. Using the superposition principle, it is clear that the error being discharged, to the inputs of the operational amplifier at n=1, is the sum of the error due to the input E at previous times: that is, when n=0, −1, −2, ... . Hence this error is equal to the sum of the series calculated in the example given above, with reference to FIG. 9.

By applying the steady state condition, the error can be calculated as follows.

TABLE 5

| | $C_{2m}$ | $C_{2m-1}$ | $C_{2m-2}$ | $C_{2m-3}$ | $C_{2m-4}$ | ... | C3 | C2 | C1 |
|---|---|---|---|---|---|---|---|---|---|
| | (n = 1) | | | | | | | | |
| PHI1 | 0 | $Q_{m-1}$ | $Q_{m-1}$ | $Q_{m-2}$ | $Q_{m-2}$ | ... | Q3 | Q2 | Q1 = C × E |
| PHI0 | $Q_{m-1}/2$ | $Q_{m-1}/2$ | $(Q_{m-1} + Q_{m-2})/2$ | $(Q_{m-1} + Q_{m-2})/2$ | $(Q_{m-2} + Q_{m-3})/2$ | ... | $(Q3 + Q2)/2$ | $(Q1 + Q2)/2$ | $(Q1 + Q2)/2$ |

TABLE 6

| | $C_{2m}$ | $C_{2m-1}$ | $C_{2m-2}$ | $C_{2m-3}$ | $C_{2m-4}$ | ... | C2 | C1 |
|---|---|---|---|---|---|---|---|---|
| | (n = 2) | | | | | | | |
| PHI1 | 0 | $Q_{m-1}/2 + Q_{m-2}/4$ | $Q_{m-1}/2 + Q_{m-2}/4$ | $Q_{m-1}/4 + Q_{m-2}/2 +$ | $Q_{m-1}/4 + Q_{m-2}/2 +$ | ... | $Q1/2 + Q2/4 +$ | Q1 = C × E |

TABLE 6-continued

| | | | (n = 2) | | | | |
|---|---|---|---|---|---|---|---|
| $C_{2m}$ | $C_{2m-1}$ | $C_{2m-2}$ | $C_{2m-3}$ | $C_{2m-4}$ | ... | C2 | C1 |
| | | | $Q_{m-3}/4$ | $Q_{m-3}/4$ | | $Q3/4$ | |

If we consider the steady state condition, then:

$$Q_{m-1} = \frac{Q_{m-1}}{2} + \frac{Q_{m-2}}{4} \text{, so that } Q_{m-2} = Q_{m-1} \times 2$$

$$Q_{m-2} = \frac{Q_{m-1}}{4} + \frac{Q_{m-2}}{2} + \frac{Q_{m-3}}{4} \text{, so that } Q_{m-3} = Q_{m-1} \times 3$$

$$Q_{m-3} = \ldots$$

$$Q2 = \frac{Q1}{2} + \frac{Q2}{4} + \frac{Q3}{4} \text{, so that } Q1 = Q_{m-1} \times m$$

Thus, the charge being discharged at the second phase PHI1 of time n=1 is $$\frac{Q_{m-1}}{2} = \frac{(C \times E)}{2 \times m}$$

The remainder of the charge is distributed amongst the capacitors in the circuit. Thus, a 2 m stage circuit suppresses the error by a factor of 2 m.

For a circuit comprising an odd number of stages, the error is reduced by a factor m, where m is the number of stages.

Upon switching, each capacitor generates a thermal fluctuation of its charge and voltage. The mean square of the thermal fluctuation is given by the following equation.

$$\sqrt{<Q^2>} = \sqrt{K \times T \times C} \quad (4)$$

where

K is the Boltzman constant

T is the absolute temperature

C the capacitor value

For the known circuit of FIG. 1, the resultant thermal noise is dependent on the sum of the statistical charge, which is summed into the integrator at the end of the two phases of operation and is given by, $$\sqrt{<Q^2>} = \sqrt{2 \times K \times T \times C} \quad (4a)$$

When two equal capacitors are connected in series, the thermal noise in each of them equals $$\sqrt{<Q^2>} = \sqrt{\frac{K \times T \times C}{2}}$$

The factor 2 relates to the equivalent half capacitor value. The charges on each capacitor are equal in value and opposite in sign.

The thermal fluctuations of the present invention will now be estimated by way of example with reference to the differential switched capacitor circuit shown in FIG. 9. In this embodiment, each stage has a connection to analog ground VAG such as the circuit shown in FIG. 9. Only one differential path is considered. However, it will be appreciated that the second path has the same noise due to the symmetry of the circuit.

It is possible to show that for an n-stage differential switched capacitor circuit in accordance with the invention the total noise contribution, due to thermal fluctuations, is $$\sqrt{<Q^2>} = \sqrt{K \times T \times C \times 2/n} \quad (5)$$

The proof of equation 5 is complex. The principle of its calculation will now be shown and demonstrated for two- and six- stage differential switched capacitor circuits.

As in the previous section the set of capacitors $20^1$, $24^1$, $20^2$ and $24^2$ will be referred to as C1, C2 ... Cm. Random variables $a_i$ and $b_i$ are defined such that $$<a_i^2> = K \times T \times C/2 \quad (6)$$

$$<b_i^2> = K \times T \times C \quad (7)$$

The variables $a_i$ and $b_i$ are statistically independent.

Each capacitor when switched, contributes a charge fluctuation as described above. The charge contributions can be denoted as shown in Table 7. These contributions only include the current state of thermal fluctuations and not contributions from thermal fluctuations from previous cycles.

TABLE 7

| | C1 | C2 | C3 | C4 | C5 | ... | $C_{2m-2}$ | $C_{2m-1}$ | $C_{2m}$ |
|---|---|---|---|---|---|---|---|---|---|
| PHI1 | $b_1$ | $-a_3$ | $a_3$ | $-a_5$ | $a_5$ | | $-a_{2m-1}$ | $a_{2m-1}$ | $b_{2m-1}$ |
| PHI0 | $-a_2$ | $a_2$ | $-a_4$ | $a_4$ | $-a_6$ | | $a_{2m-2}$ | $-a_{2m}$ | $a_{2m}$ |

In table 7, the sign "−" before the variable $a_i$ or $b_i$, indicates that the sampled noise is anti-correlated to that indicated by the variable $a_i$ or $b_i$.

Since the variables $a_i$ and $b_i$ are statistically independent, the charge contributions do not vary with time. Any charge contributions that are discharged onto the inputs of the operational amplifier, are added to the total thermal noise of the circuit. The total contribution is the square root of the sum of the squares of all the contributions.

By applying the superposition principle as described above to a two-stage system, the charge contributions are:

TABLE 8

|      | C1     | C2    |
|------|--------|-------|
| PHI1 | $b_1$  | $b_2$ |
| PHI0 | $-a_2$ | $a_2$ |

Since the $b_1$ and $b_2$ terms look like the noise error discussed above, the $b_2$ term contributes $b_2/2$ and the $b_1$ term contributes $b_1/2$ to the noise at the operational amplifier's inputs. With respect to the a2 terms, the a2 term (on the right) adds to the integrator in the next second phase PHI1 and the −a2 term (on the left) is dumped out.

The total contribution is therefore:

$$\sqrt{\frac{b_1^2}{4}+\frac{b_2^2}{4}+a_1^2} = K \times T \times C$$

as required by equation 5 above.

For a six-stage system the charge contributions are:

TABLE 9

|      | C1     | C2     | C3     | C4     | C5     | C6    |
|------|--------|--------|--------|--------|--------|-------|
| PHI1 | $b_1$  | $-a_3$ | $a_3$  | $-a_5$ | $a_5$  | $b_7$ |
| PHI0 | $-a_2$ | $a_2$  | $-a_4$ | $a_4$  | $-a_6$ | $a_6$ |

Since the terms $b_1$ and $b_7$ are similar to the integrator error terms discussed above, the $b_1$ term contributes $b_1/6$ and the $b_7$ term contributes $b_7/6$, to the integrator (operational amplifier).

Table 10 gives the contribution of the $a_3$ terms, where every quantity is normalised to the $a_3$ term.

TABLE 10

|      | C6     | C5     | C4     | C3     | C2     | C1     | Integrator           |
|------|--------|--------|--------|--------|--------|--------|----------------------|
| PHI1 | 0      | 0      | 0      | −1     | 1      | 0      | 0                    |
| PHI0 | 0      | 0      | −1/2   | −1/2   | 1/2    | 1/2    | 0                    |
| PHI1 | 0      | −1/4   | −1/4   | 0      | 0      | 0      | 1/2                  |
| PHI0 | −1/8   | −1/8   | −1/8   | −1/8   | 0      | 0      |                      |
| PHI1 | 0      | −1/8   | −1/8   | −1/16  | −1/16  | 0      |                      |
| PHI0 | −1/16  | −1/16  | −3/32  | −3/32  | −1/32  | −1/32  |                      |
| PHI1 | 0      | −5/64  | −5/64  | −1/16  | −1/16  | 0      | 1/2−1/32             |
| PHI0 | −5/128 | −5/128 | −9/128 | −9/128 | −1/32  | −1/32  |                      |
| PHI1 | 0      | −7/128 | −7/128 | −13/256| −13/256| 0      | 1/2−1/32−1/32        |
| PHI0 | −7/256 | −7/256 | −27/256| −27/256| −13/512| −13/512|                      |
| PHI1 | 0      | ...    | ...    | ...    | ...    | 0      | 1/2−1/32−1/32−13/512 |
| PHI0 | ...    | ...    | ...    | ...    | ...    | ...    |                      |

The contributions, in the integrator column, form a geometrical series, which adds up to be approximately ⅓. Each of the terms $a_2$, $a_3$, $a_4$ and $a_6$ contribute a ⅓ as well.

Thus, the cumulative contribution is $$\sqrt{\frac{(b_1^2+b_2^2)}{36}+\frac{(a_2^2+a_3^2+a_4^2+a_5^2+a_6^2)}{9}} = \sqrt{K \times T \times C/3} \quad (8)$$

Equation 8 therefore confirms that the assertion (equation 5) is correct.

The present invention therefore provides a $1/(\sqrt{n})$ improvement in the signal to noise ratio compared to the prior art circuit of FIG. 1 (see equations 4a and 5).

Thus, a further advantage of the differential switched capacitor circuit in accordance with the present invention is that it has lower thermal noise, than the prior art circuits. This means that smaller capacitors can be used, which saves power consumption of the switched capacitor circuit.

Figure 12:
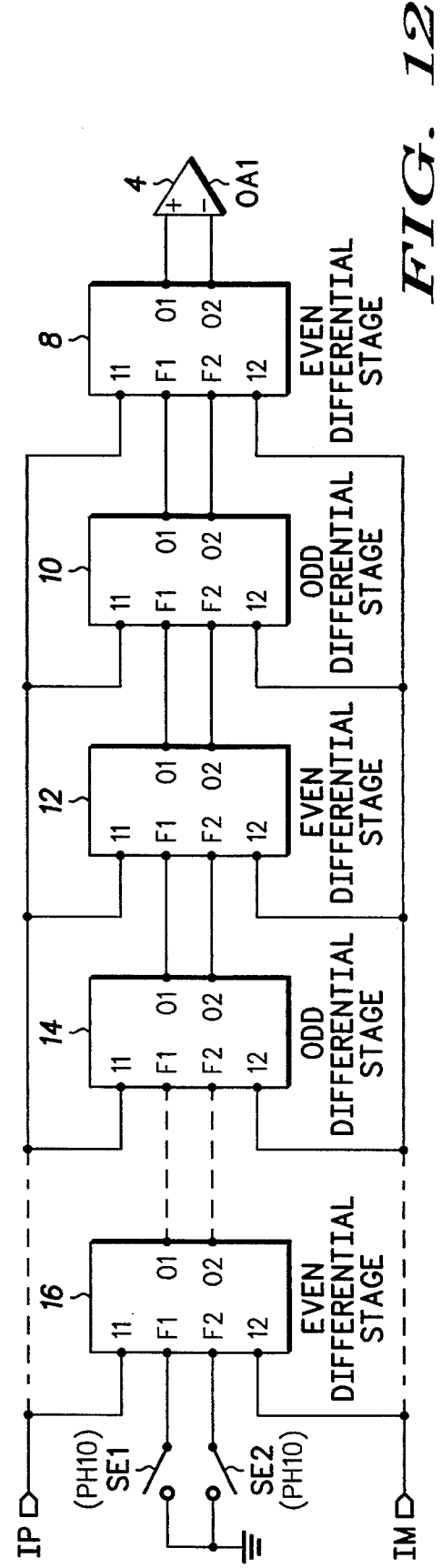
FIG. 12 is a block schematic diagram of a fourth differential switched capacitor circuit in accordance with the present invention.

Different embodiments of the invention have been described herein. However, it is not intended to limit the invention to those embodiments described herein, since other combinations would be readily apparent to a person skilled in the art. For example, the operational amplifier may be connected to one of the second types of stage EVEN, as opposed to the first type ODD as shown in FIGS. 2–4. An example of such a circuit is shown in FIG. 12 (like components are referred to by the same reference numeral). The principle of operation is the same as in the previous cases. However, charge is transferred to the operational amplifier 4 during the first phase PHI0. That is, simultaneously with input sampling.

Each of the embodiments described so far switches the capacitors between one input (IP or IM) and analog ground VAG, or a medium point of two differential capacitors.

Figure 13:
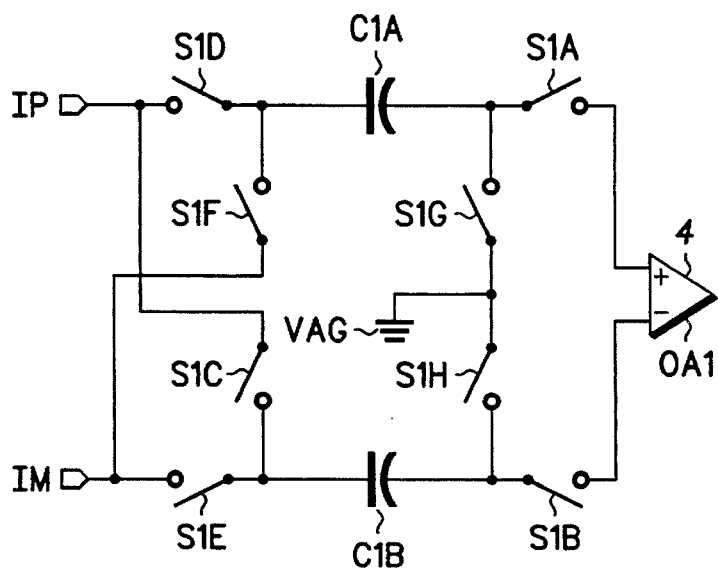
FIG. 13 is a schematic circuit diagram of a fifth differential switched capacitor circuit.

Another widely used class of switched-capacitor circuits, switches capacitors between the input terminals. That is, between IP and IM terminals. An example of such a circuit is shown in FIG. 13. The present invention may also be applied to this class of switched-capacitor circuit.

Figure 14:
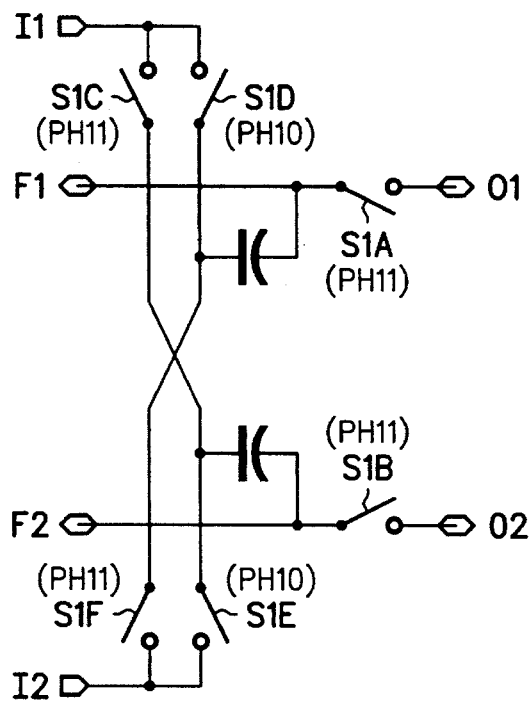
FIG. 14 is a circuit diagram of a third, first type of switched capacitor stage in accordance with the present invention for use in a differential switched capacitor circuit such as that shown in FIG. 2, 3, 4 or 13.

The internal structure of the first type of stage ODD for use in such a class of switched capacitor circuits (and also those shown in FIGS. 2–4) is shown in FIG. 14 (like components are referred to by the same reference numeral). The structure of the second type of stage EVEN for use in such a class of switched capacitor circuits (and also those shown in FIGS. 2–4) is shown in FIG. 15 (like components are referred to by the same reference numeral).

Figure 15:
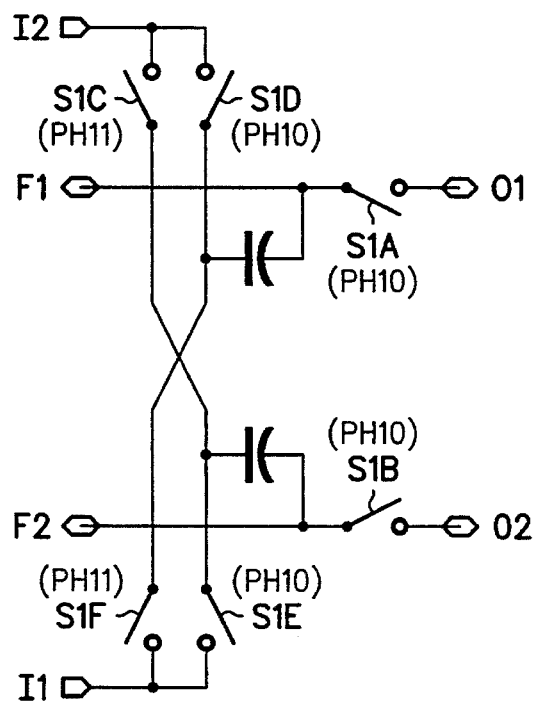
FIG. 15 is a circuit diagram of a third, second type of switched capacitor stage in accordance with the present invention for use in a differential switched capacitor circuit such as that shown in FIG. 2, 3, 4 or 13.

Since the voltage swing on the switched capacitors in the circuits shown in FIGS. 5–8 is twice as small as that of the capacitors of FIGS. 14 and 15, the size of the capacitors used in these circuits (FIGS. 5–8) should be twice the size of those used in the latter circuits (FIGS. 14 and 15), in order to achieve the necessary charge balance.

In summary, the present invention provides a differential switched capacitor circuit which shares the noise error between the capacitors in a plurality of stages so as to reduce the signal-to-noise ratio. The invention reduces the aliasing of high frequency noises and spikes and also reduces the low frequency noise, due to, for example, thermal fluctuations of the switching capacitors.

We claim:

1. A differential switched capacitor circuit for sampling a differential input signal in different sampling phases and for correcting errors at an output thereof, the circuit comprising:

m switched capacitor stages coupled in a chain, a first stage being coupled to the output of the circuit, and wherein the m capacitor stages comprise at least one first type of stage and at least one second type of stage, the stages being arranged such that an adjacent stage in the chain is a different type, and wherein each type of stage comprises first and second capacitors, first and second inputs selectively coupled to receive the differential input signal, third and fourth inputs and first and second outputs for selectively coupling to the third and fourth inputs of the first stage, the first and second outputs of the mth stage or the third and fourth inputs or first and second outputs of an adjacent stage depending on the sampling phase such that a charge representative of the error is equally shared between adjacent stages in the chain, the mth stage being selectively coupled to an end node so as to cancel the charge thereon, wherein during a first sampling phase, the first capacitor of the first type of stage is coupled between the first input and the third input and the second capacitor of the first type is coupled between the second input and the fourth input and the first capacitor of the second type of stage is coupled between the second input and the first output and the second capacitor of the second type is coupled between the first input and the second output, wherein during a second sampling phase, the first capacitor of the first type is coupled between a first node and the first output and the second capacitor of the first type is coupled between the first node and the second output, and the first capacitor of the second type is coupled between a second node and the third input and the second capacitor of the second type is coupled between the second node and the fourth input, whereby after a number of first and second sampling phases the error at the output is substantially reduced by a factor of up to 1/m.

2. A differential switched capacitor circuit according to claim 1 wherein the first and second nodes are coupled to ground.

3. A differential switched capacitor circuit according to claim 1 wherein the first type of stage further comprises a first switch coupled between the first and second capacitors, wherein during the first sampling phase the first switch is open and during the second sampling phase the first switch is closed whereby the first and second capacitors of the first type are coupled together to the first node, and wherein the second type of stage further comprises a first switch coupled between the first and second capacitors, wherein during the first sampling phase the first switch is open and during the second sampling phase the first switch is closed whereby the first and second capacitors of the second type are coupled together to the second node.

4. A differential switched capacitor circuit according to claim 1 wherein the first stage and the mth stage are either both the same type of stage or the first stage is one type and the mth stage is the other type.

5. A differential switched capacitor circuit according to claim 1 for correcting errors at differential inputs of an operational amplifier wherein the first and second outputs of the first stage are for coupling to the differential inputs of the operational amplifier.

6. A differential switched capacitor circuit according to claim 1 wherein the third and fourth inputs of the mth stage are coupled to switch means, which is open or closed depending on the sampling phase, when the switch means is closed, the third and fourth inputs are coupled to the end node.

7. A differential switched capacitor circuit according to claim 6 wherein the mth stage comprises either the first type of stage wherein the switch means is closed during the first sampling phase or the second type of stage wherein the switch means is closed during the second sampling phase.

8. A differential switched capacitor circuit according to claim 6 wherein the third and fourth inputs of the mth stage are coupled together via the switch means.

9. A differential switched capacitor circuit according to claim 1 wherein the end node is coupled to ground.

10. A differential switched capacitor circuit for sampling a differential input signal in different sampling phases and for correcting errors at an output thereof, the circuit comprising:

m switched capacitor stages coupled in a chain, a first stage being coupled to the output of the circuit, and wherein the m capacitor stages comprise at least one first type of stage and at least one second type of stage, the stages being arranged such that an adjacent stage in the chain is a different type, and wherein each type of stage comprises first and second capacitors, first and second inputs selectively coupled to receive the differential input signal, third and fourth inputs and first and second outputs for selectively coupling to the third and fourth inputs of the first stage, the first and second outputs of the mth stage or the third and fourth inputs or first and second outputs of an adjacent stage depending on the sampling phase such that a charge representative of the error is equally shared between adjacent stages in the chain, the mth stage being selectively coupled to an end node so as to cancel the charge thereon, wherein during a first sampling phase, the first capacitor of the first type of stage is coupled between the first input and the third input and the second capacitor of the first type is coupled between the second input and the fourth input and the first capacitor of the second type of stage is coupled between the second input and the first output and the second capacitor of the second type is coupled between the first input and the second output, wherein during a second sampling phase, the first capacitor of the first type is coupled to the second capacitor and the first output and the second capacitor of the first type is coupled to the first capacitor and the second output, and the first capacitor of the second type is coupled to the second capacitor and the third input and the second capacitor of the second type is coupled to the first capacitor and the fourth input, whereby after a number of first and second sampling phases the error at the output is substantially reduced by a factor of up to 1/m.

11. A differential switched capacitor circuit according to claim 10 wherein the first stage and the mth stage are either both the same type of stage or the first stage is one type and the mth stage is the other type.

12. A differential switched capacitor circuit according to claim 10 for correcting errors at differential inputs of an operational amplifier wherein the first and second outputs of the first stage are for coupling to the differential inputs of the operational amplifier.

13. A differential switched capacitor circuit according to claim 10 wherein the third and fourth inputs of the mth stage are coupled to switch means, which is open or closed depending on the sampling phase, when the switch means is closed, the third and fourth inputs are coupled to the end node.

14. A differential switched capacitor circuit according to claim 13 wherein the mth stage comprises either the first type of stage wherein the switch means is closed during the first sampling phase or the second type of stage wherein the switch means is closed during the second sampling phase.

15. A differential switched capacitor circuit according to claim 13 wherein the third and fourth inputs of the mth stage are coupled together via the switch means.

16. A differential switched capacitor circuit according to claim 10 wherein the end node is coupled to ground.

* * * * *